United States Patent
Ko et al.

(10) Patent No.: US 7,663,728 B2
(45) Date of Patent: Feb. 16, 2010

(54) SYSTEMS FOR PROVIDING CONDUCTING PAD AND FABRICATION METHOD THEREOF

(75) Inventors: Hong-Pin Ko, Hsin-Chu (TW); Chien-Chih Chen, Hsin-Chu Hsien (TW); Chia-Cheng Lin, Chang-Hua Hsien (TW); Wen-Chieh Teng, Hsin-Chu (TW); Ping Luo, Hsin-Chu (TW)

(73) Assignee: TPO Displays Corp. (TW)

( * ) Notice: Subject to any disclaimer, the term of this patent is extended or adjusted under 35 U.S.C. 154(b) by 450 days.

(21) Appl. No.: 11/390,743

(22) Filed: Mar. 28, 2006

(65) Prior Publication Data

US 2007/0229751 A1    Oct. 4, 2007

(51) Int. Cl.
G02F 1/1345 (2006.01)
G02F 1/136 (2006.01)

(52) U.S. Cl. .................. 349/152; 349/43; 349/139
(58) Field of Classification Search .................. None
See application file for complete search history.

(56) References Cited

U.S. PATENT DOCUMENTS

| | | | |
|---|---|---|---|
| 5,731,854 A | 3/1998 | Kishida | |
| 5,818,561 A | 10/1998 | Nakanishi | |
| 5,893,623 A | 4/1999 | Muramatsu | |
| 6,198,522 B1 | 3/2001 | Yanagi | |
| 6,281,954 B1 * | 8/2001 | Lim et al. | 349/43 |
| 6,558,971 B2 * | 5/2003 | Hsieh et al. | 438/30 |
| 6,700,636 B2 | 3/2004 | Kim et al. | |
| 6,731,369 B2 | 5/2004 | Choo | |
| 6,839,120 B2 | 1/2005 | Choo et al. | |
| 7,057,676 B2 * | 6/2006 | Yeh et al. | 349/43 |
| 2004/0114372 A1 * | 6/2004 | Han et al. | 362/330 |
| 2004/0179143 A1 * | 9/2004 | Yoo et al. | 349/43 |
| 2006/0170836 A1 * | 8/2006 | Kondo et al. | 349/43 |

FOREIGN PATENT DOCUMENTS

| | | |
|---|---|---|
| CN | 1347142 | 5/2002 |
| KR | 1020050067859 | 7/2005 |

OTHER PUBLICATIONS

English Abstract for CN 1347142.
English Abstract for KR 10-2005-0067859.

* cited by examiner

*Primary Examiner*—Tina M Wong
(74) *Attorney, Agent, or Firm*—Thomas, Kayden, Horstemeyer & Risley, LLP.

(57) ABSTRACT

A system for providing conducting pads of a display panel has a base layer on a substrate, a first insulator on the base layer having a plurality of grooves, a second conductive layer inside the grooves, and a patterned third conductive layer covering the second conductive layer. The first insulator serves as a barricade for fixing the second conductive layer in the grooves.

17 Claims, 14 Drawing Sheets

SYSTEMS FOR PROVIDING CONDUCTING PAD AND FABRICATION METHOD THEREOF

BACKGROUND OF THE INVENTION

1. Field of the Invention

The invention relates to a system for providing conducting pads.

2. Description of the Prior Art

Due to the fast development of electronics, the requirements of displays used as interfaces between machines and human are becoming more and more strict. Because liquid crystal displays (LCD) have light weight, thinness, low energy requirements, no radiation, and other good qualities, they have become the main stream in the market and are widely used in notebooks, personal digital assistants (PDA), digital cameras, cellular phones, and other communication and information equipments. Furthermore, LCDs also tend to replace the traditional cathode ray tube (CRT) monitors and CRT TVs in recent years. On the other hand, organic-light-emitting-diode (OLED) displays also have drawn attention due to the research of organic materials and their advantages of being self-light-emitting, having a high resolution, and having wide viewing angles. As a result, LCD displays, OLED displays and other flat-panel displays have become indispensable for mobile information electronics and have become more popular in people's lives.

A conventional flat display, whether a LCD or an OLED display, contains a pixel array area and a periphery circuit area, wherein a plurality of conducting pads are formed in the periphery circuit area for electrically connecting to external circuits. Please refer to FIG. 1 and FIG. 2. FIG. 1 is a schematic diagram of a top view of a flat display panel 10 according to the prior art, and FIG. 2 is a side view of the flat display panel 10 shown in FIG. 1. The flat display panel 10 is a LCD, comprising two glass substrates 12, 14, and a liquid crystal layer 16 between the glass substrates 12 and 14. As shown in FIG. 1, the upper glass substrate 12 has a smaller size than that of the lower glass substrate 14. Therefore, a portion of the glass substrate 14 is covered by the glass substrate 12 and which defined as a covered region 18, and another portion of the glass substrate 12 is an uncovered region, defined as a periphery circuit area 20. The covered area 18 includes a pixel array area (active area, AA) 11 and a control circuit area 13.

The periphery circuit area 20 has a plurality of periphery circuits and conducting pads 22 for electrically connecting to external circuits and sending signals through internal circuits in the flat display panel 10, such as DC-DC voltage lines or scan control signal lines. A conventional conducting pad structure is illustrated in FIG. 3, which is a cross-section view of the conducting pad 22 shown in FIG. 1. Conventionally, the conducting pad 22 is a multi-layer structure. As shown in FIG. 3, the conducting pad 22 in the periphery circuit area 20 comprises a first insulation layer 24, a first conductive layer 26, a second insulation layer 28, a second conductive layer 30, and a third conductive layer 32 in sequence on the glass substrate 14, wherein the third conductive layer 32 covers the surfaces of the second conductive layer 30, including the top surface and the side surfaces of the second conductive layer 30. In general, the second conductive layer 30 is formed with metal materials with lower impedance, and the third conductive layer 32 is formed with materials with higher impedance while the hardness of the materials of the third conductive layer 32 are harder than that of the materials of the second conductive layer 30.

Since the periphery circuit area 20 on the glass substrate 14 is not covered by the glass substrate 12, it is unavoidable to suffer stresses or forces during the fabrication process, assembling process, or transferring process. However, the material of the third metal layer 32 is usually so brittle that it is easily broken under such stresses or forces. Once the third metal layer 32 is broken by an external force, it may sequentially scratch and cave the second metal layer 30 formed with soft materials, and the third metal layer 32 under the external force may even shift the second metal layer 30 to cause the second metal layer 30 contact another element on the glass substrate 14, resulting in an element short. Also, when the external force scratches the third metal layer 32 and the second metal layer 30, a scratching trace may occur on the surface of the conducting pad 22 such that the flat display panel 10 becomes an inferior product under a visual test.

Accordingly, it is still an important issue for the manufacturer of displays to provide a conducting pad that has preferable structure to avoid traces, shifts or element shorts under external stresses or forces in the uncovered periphery circuit area.

SUMMARY OF THE INVENTION

Systems for providing conducting pad are provided.

An embodiment of such a system with conducting pads of a display panel comprises a base layer on a substrate, a first insulator on the base layer having a plurality of grooves, a second conductive layer filled inside the grooves, and a patterned third conductive layer covering the second conductive layer.

Since the second conductive layer is filled inside the grooves and the first insulator is composed of hard materials, the first insulator serves as a barricade to fix the positions of the second conductive layer so that scrapes or position shifts of the second conductive layer with soft materials can be avoided.

These and other objectives of the present invention will no doubt become obvious to those of ordinary skill in the art after reading the following detailed description of the preferred embodiment that is illustrated in the various figures and drawings.

DETAILED DESCRIPTION

The present invention is directed to a system with conducting pads that have a second conductive layer, wherein the position of the second conductive layer are fixed by a first insulator serving as a barricade.

Figure 1:
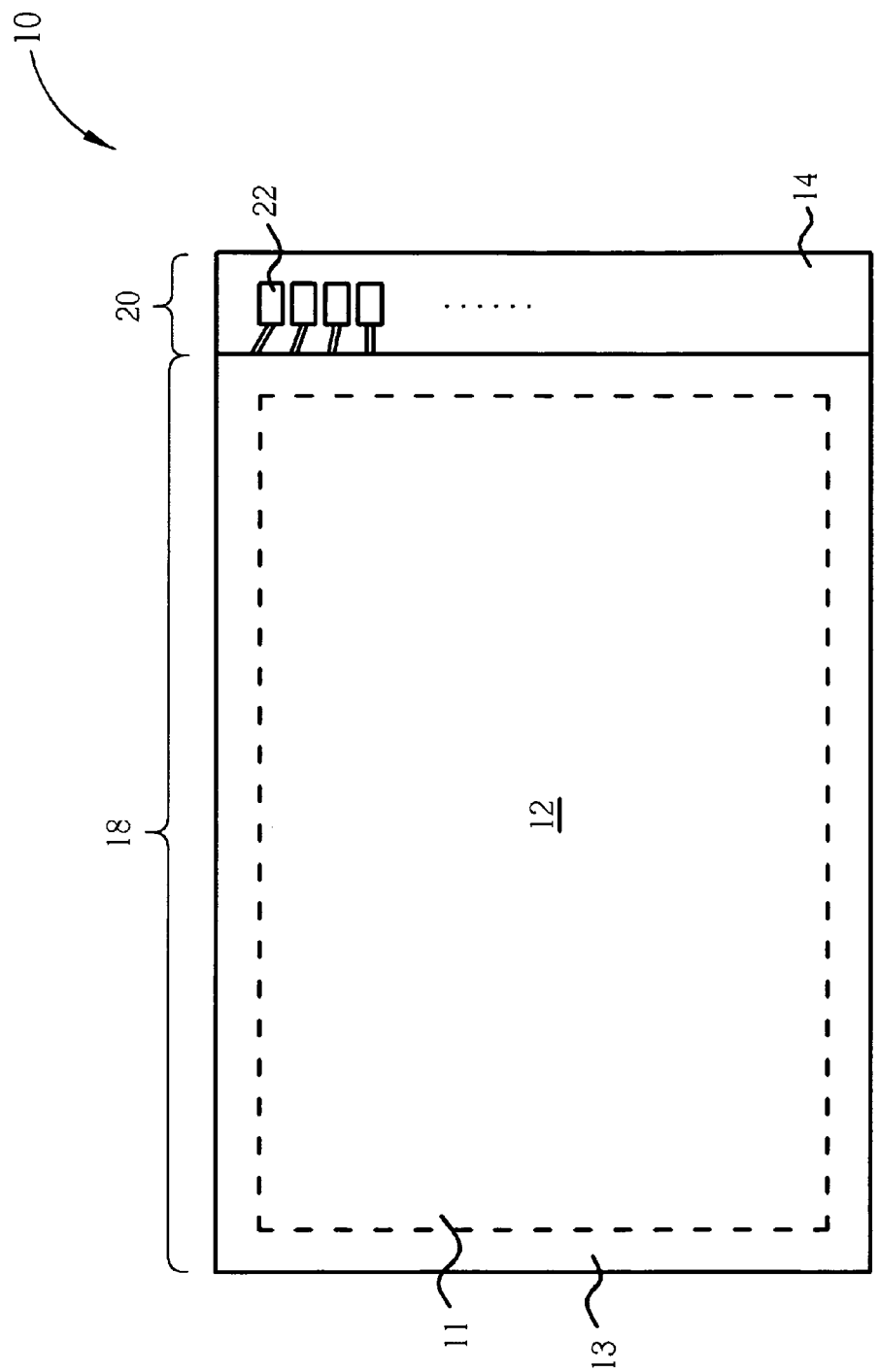
FIG. 1 is a schematic diagram of a top view of a flat display panel according to the prior art.
Figure 2:
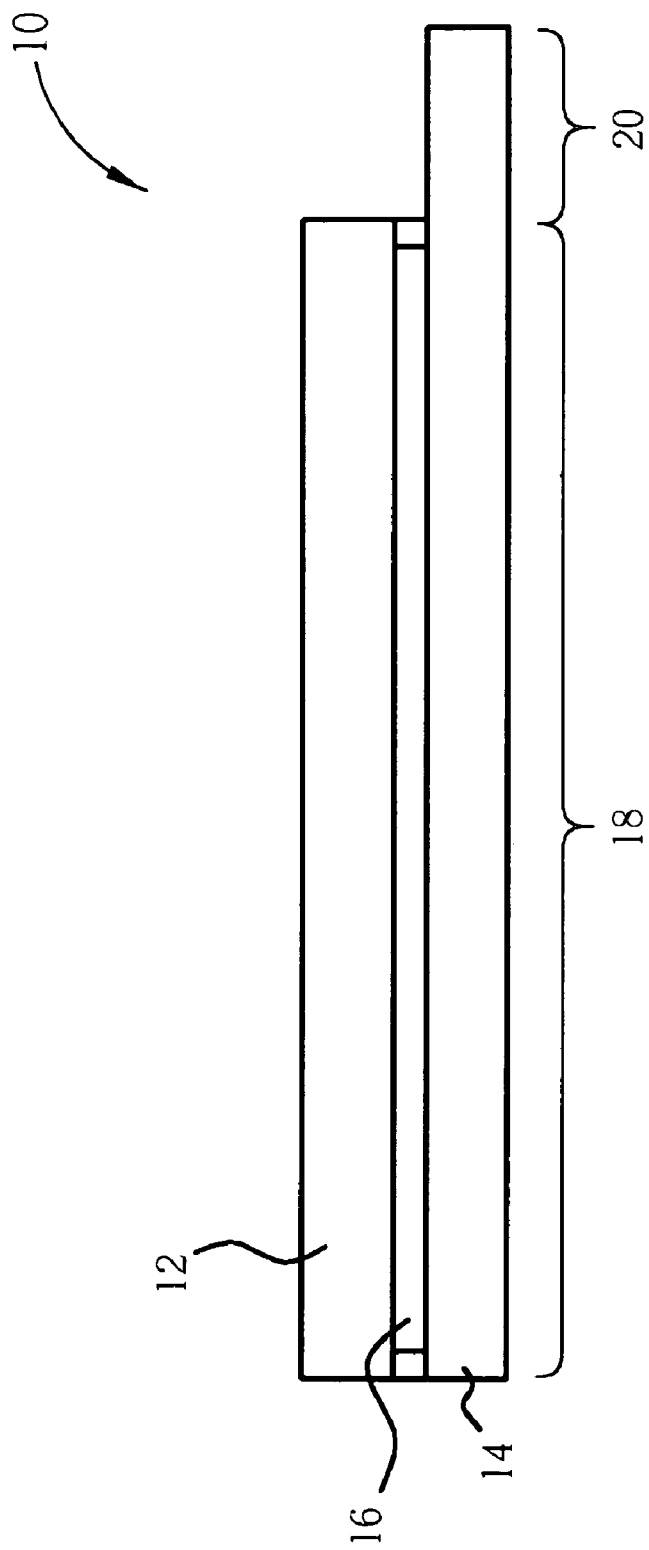
FIG. 2 is a side view of the flat display panel shown in FIG. 1.
Figure 3:
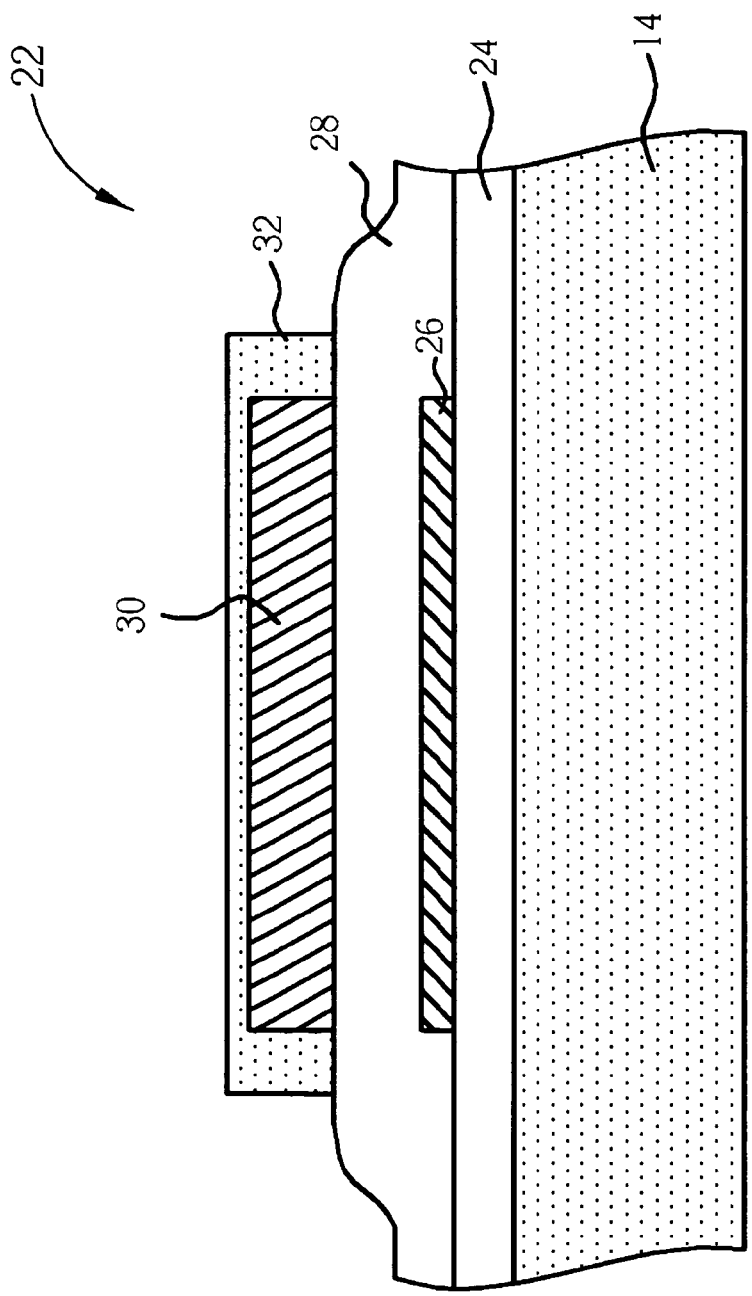
FIG. 3 is a cross-section view of the conducting pad shown in FIG. 1.
Figure 4:
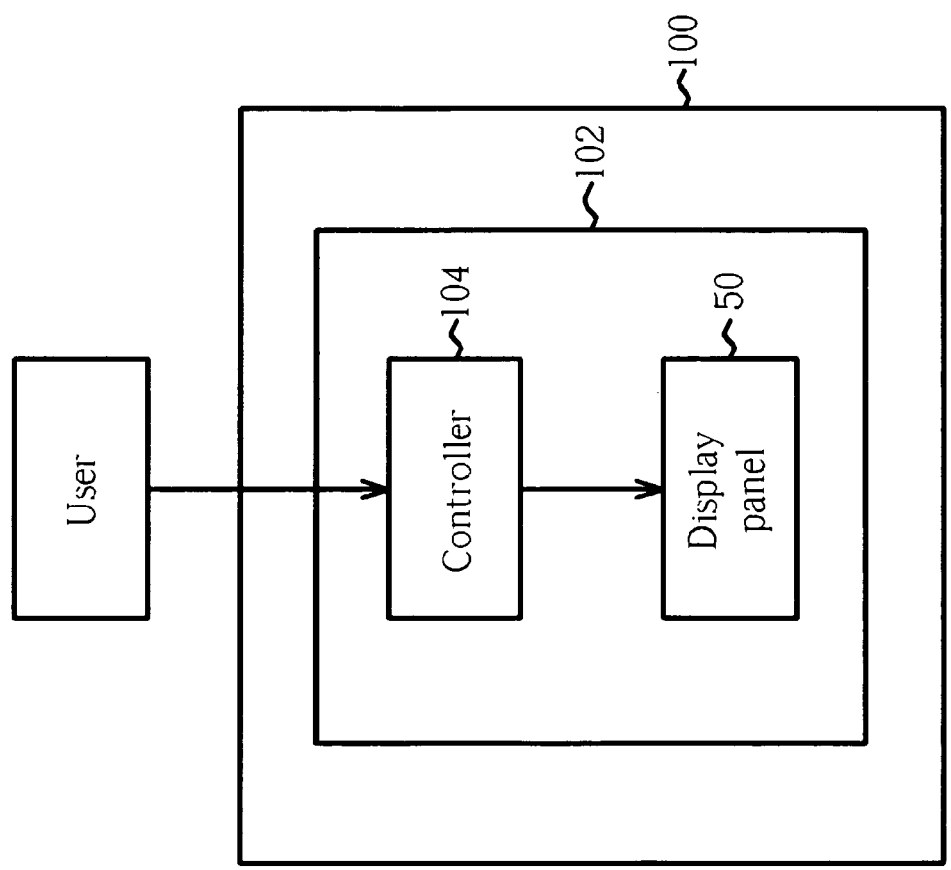
FIG. 4 is a block diagram of an electronic device incorporating a display panel according to the present invention.
Figure 5:
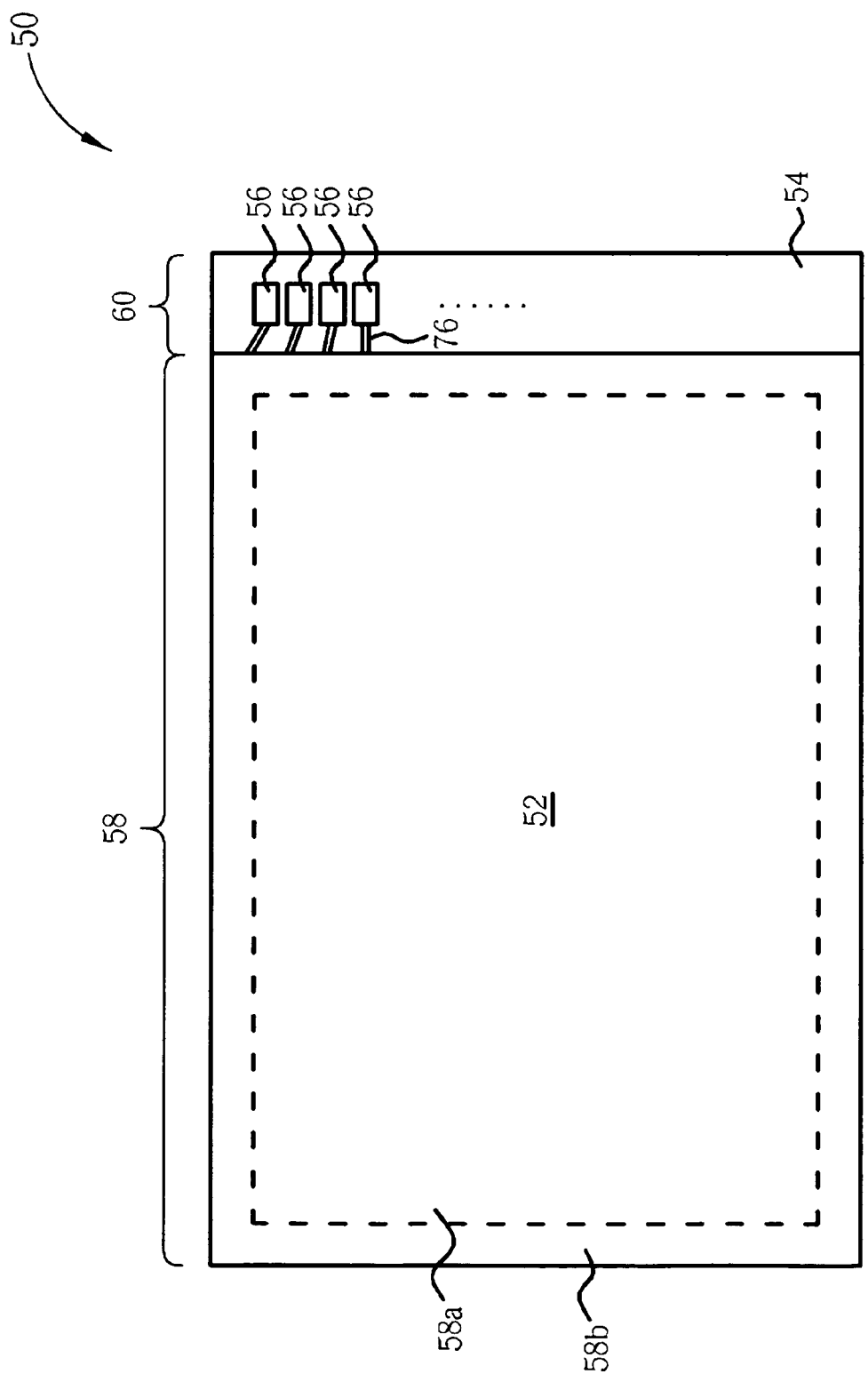
FIG. 5 is a schematic diagram of the display panel shown in FIG. 4.

Please refer to FIGS. 4-5. FIG. 4 is a block diagram of an electronic device 100 incorporating the display panel 50 according to the present invention, and FIG. 5 is a schematic diagram of the display panel 50 shown in FIG. 4. As shown in FIG. 4, the electronic device 100 comprises a display device 102, such as a LCD device, and the display device 102 comprises a controller 104 and the display panel 50, wherein the controller 104 is coupled to the display panel 50 and can be operative to control the display panel 50 to render images in accordance with input. The electronic device 100 may be a laptop computer, a mobile phone, a digital camera, a personal digital assistant (PDA), a desktop computer, a television, a car display or a portable DVD player. Therefore, a user may control the electronic device 100 through the controller 104 to operate the display panel 50.

Referring to FIG. 5, the display panel 50 comprises a first substrate 52 and a second substrate 54 positioned below the first substrate 52. The second substrate 54 has a size larger than the size of the first substrate 52, and a portion of the second substrate 54 is an uncovered region defined as a periphery circuit area 60 while the portion of the second substrate 54 covered by the first substrate 52 is defined as a covered region 58. The covered region 58 includes a pixel array area 58a and a control circuit area 58b. In a preferred embodiment of the present invention, the display panel 50 is a LCD or an OLED display.

Figure 6:
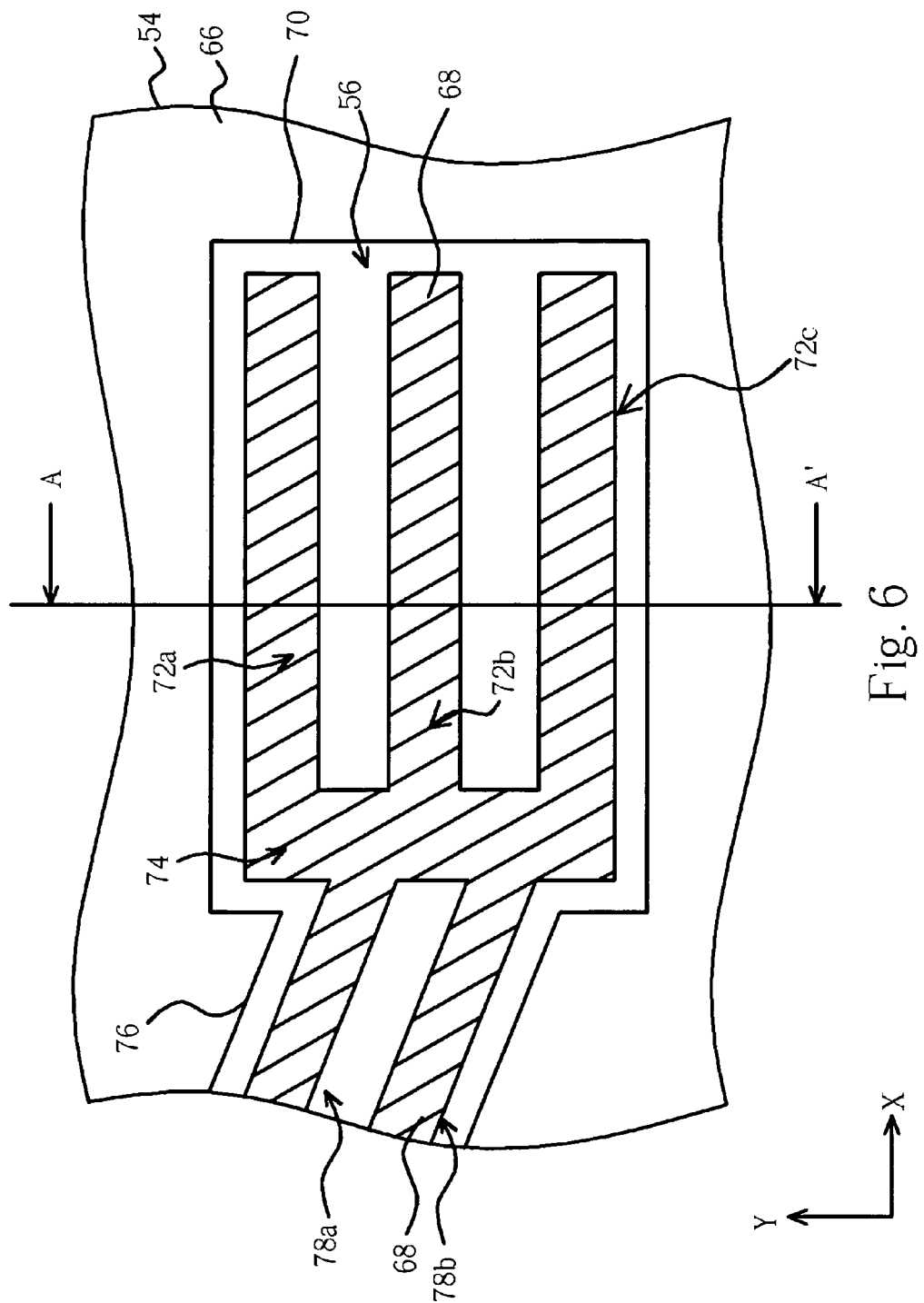
FIG. 6 is an enlarged diagram of the conducting pad and periphery circuit shown in FIG. 5.
Figure 7:
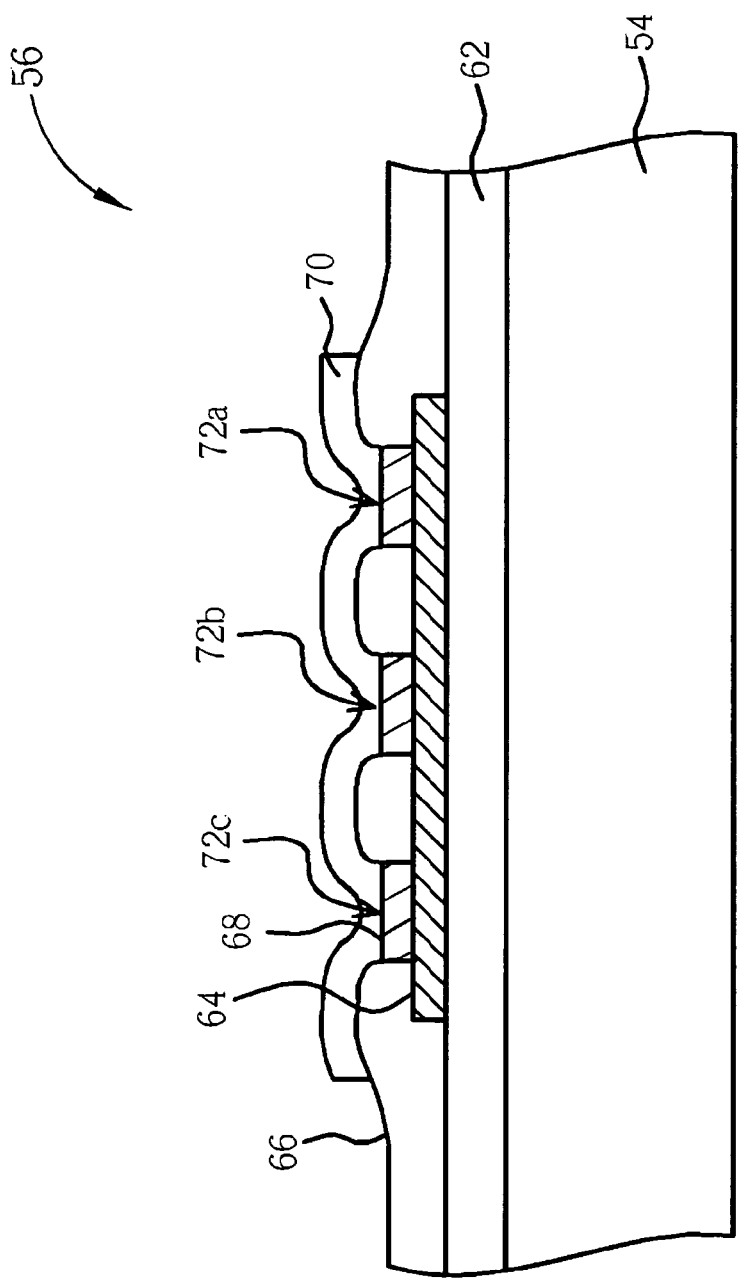
FIG. 7 is a cross-sectional view along line A-A' of the conducting pad shown in FIG. 6.

The periphery circuit area 60 comprises a plurality of conducting pads 56 and wires 76 on the second substrate 54. Each conducting pads 56 is used for connecting at least an external circuit through an IC chip or a flexible printed circuit (FPC) board with at least an internal circuit. Please refer to FIGS. 6-7, wherein FIG. 6 is a enlarged diagram of the conducting pad 56 and the wire 76 shown in FIG. 5 and FIG. 7 is a cross-sectional view along line A-A' of the conducting pad 56 shown in FIG. 6. The conducting pad 56 comprises a base layer 62 covering the second substrate 54 and a patterned first conductive layer 64 on the base layer 62. The base layer 62 preferably comprises insulating materials, and may be a buffer layer and formed with silicon nitride, silicon oxide or other non-conductive materials. The first conductive layer 64 preferably comprises metal materials, and more preferably comprises molybdenum (Mo) or titanium (Ti).

The conducting pad 56 further comprises a first insulator 66 covering the base layer 62 and portions of the first conductive layer 64. As shown in FIG. 6, the first insulator 66 comprises a plurality of first grooves 72a, 72b, 72c and a second groove 74 in one conducting pad 56. The first grooves 72a, 72b, 72c are parallel with each other along a first direction, such as the x-axis, and all of them connect with the second groove 74. The second groove 74 is arranged along a second direction, which is not parallel with the first direction. In a preferred embodiment, the second direction is perpendicular to the first direction. For example, the second direction is along the Y-axis, and therefore the first grooves 72a, 72b, 72c and the second groove 74 form an E-shape. A second conductive layer 68 is filled inside the first grooves 72a, 72b, 72c and the second groove 74 and is conductible in the grooves since all the first grooves 72a, 72b, 72c connect with the second groove 74.

On the second conductive layer 68, a patterned third conductive layer 70 is positioned and completely covers the second conductive layer 68 and the portions of the first insulator 66 that is above the first conductive layer 64. The materials of the patterned third conductive layer 70 preferably comprise transparent tin oxide (ITO).

The second conductive layer 68 in the first grooves 72a, 72b, 72c is arranged in a parallel connection. In addition, the first grooves 72a, 72b, 72c extend through the first insulator 66, and the second conductive layer 68 inside the first grooves 72a, 72b, 72c are electrically connected to the first conductive layer 64. Therefore, the second conductive layer 68 and the first conductive layer 64 also operate in parallel. Accordingly, even when the second conductive layer 68 in the first grooves 72a, 72b, 72c and the second groove 74 is broken, the first conductive layer 64 can still provide the conduction function of the conducting pad 56 to electrically connect external circuits with internal circuits in the display panel 50.

On the other hand, the wire 76 electrically connecting with the conducting pad 56 on the second substrate 54 is an internal circuit, and can also have the similar structure with the present invention conducting pad 56. Since a portion of each wire 76 is positioned in the periphery circuit area 60 and may not be covered by the first substrate 52, a preferable structure is provided according to the spirit of the present invention. Referring to FIG. 6, the uncovered wire 76 also comprises a patterned first conductive layer 64 (not shown in FIG. 6), a first insulator 66 having a plurality of third grooves 78a, 78b parallel with each other, a second conductive layer 68 filled inside the third grooves 78a, 78b, and a patterned third conductive layer 70 covering the second conductive layer 68 in the third grooves 78a, 78b and the patterned first conductive layer 64. Therefore, the wire 76 also has a strong structure that can resist external stresses. Accordingly, an internal circuit or a periphery circuit of the display panel 50 that is exposed on the surface of the second substrate 54 can also have a structure similar to that described-above.

Figure 8:
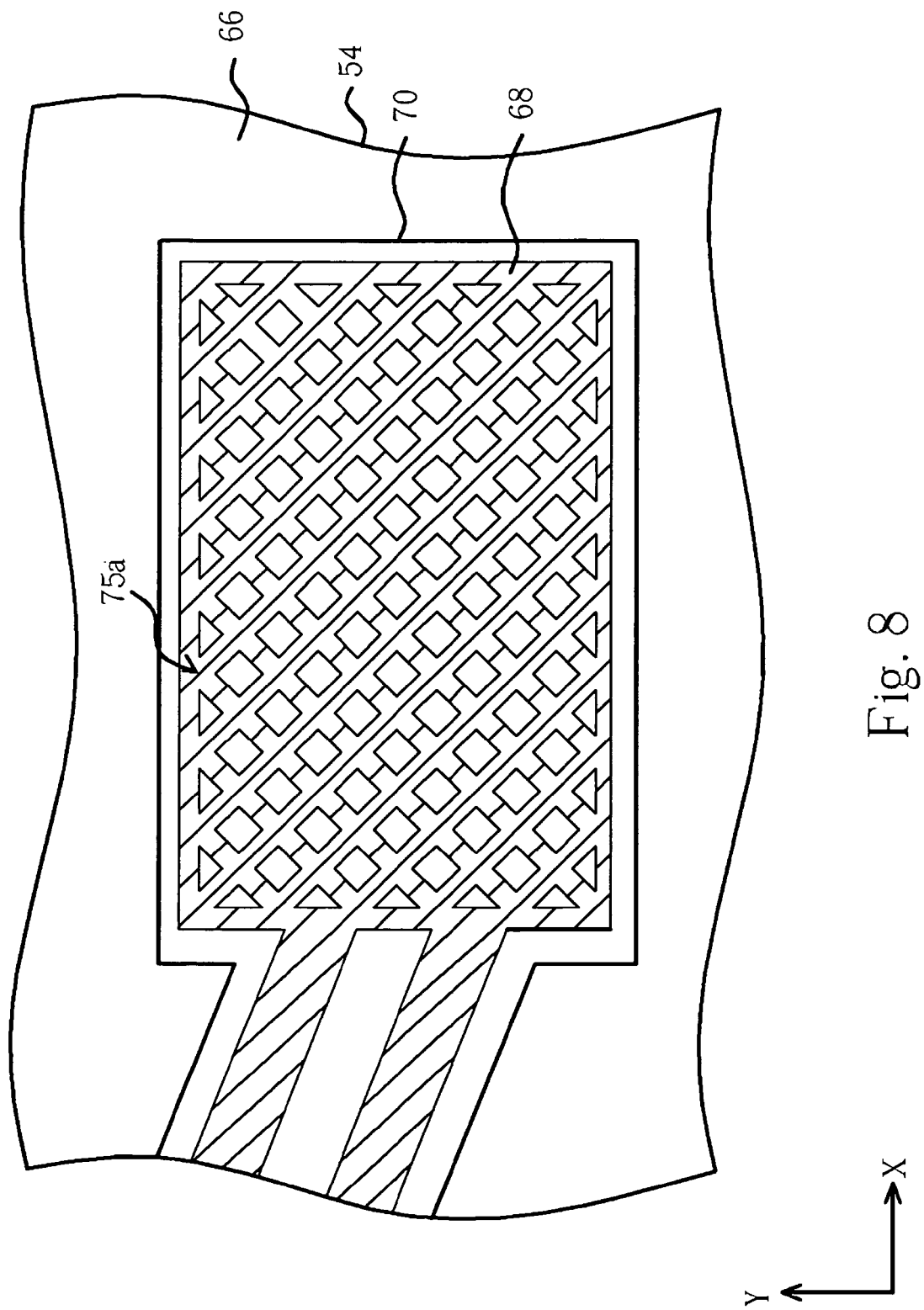
FIGS. 8-10 are enlarged schematic diagrams of conducting pads according to a second embodiment, a third embodiment, and a fourth embodiment of the present invention respectively.
Figure 9:
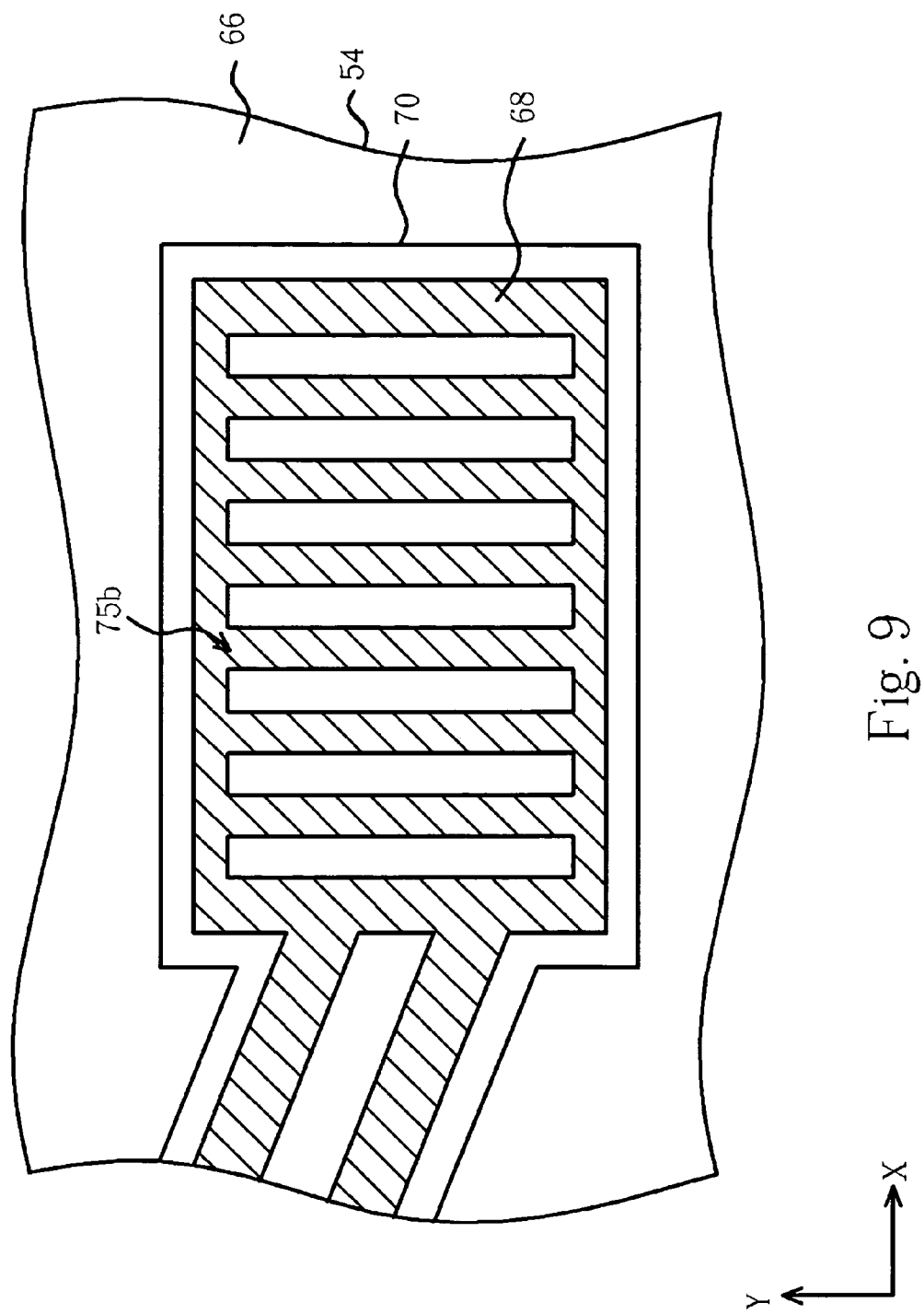
Figure 10:
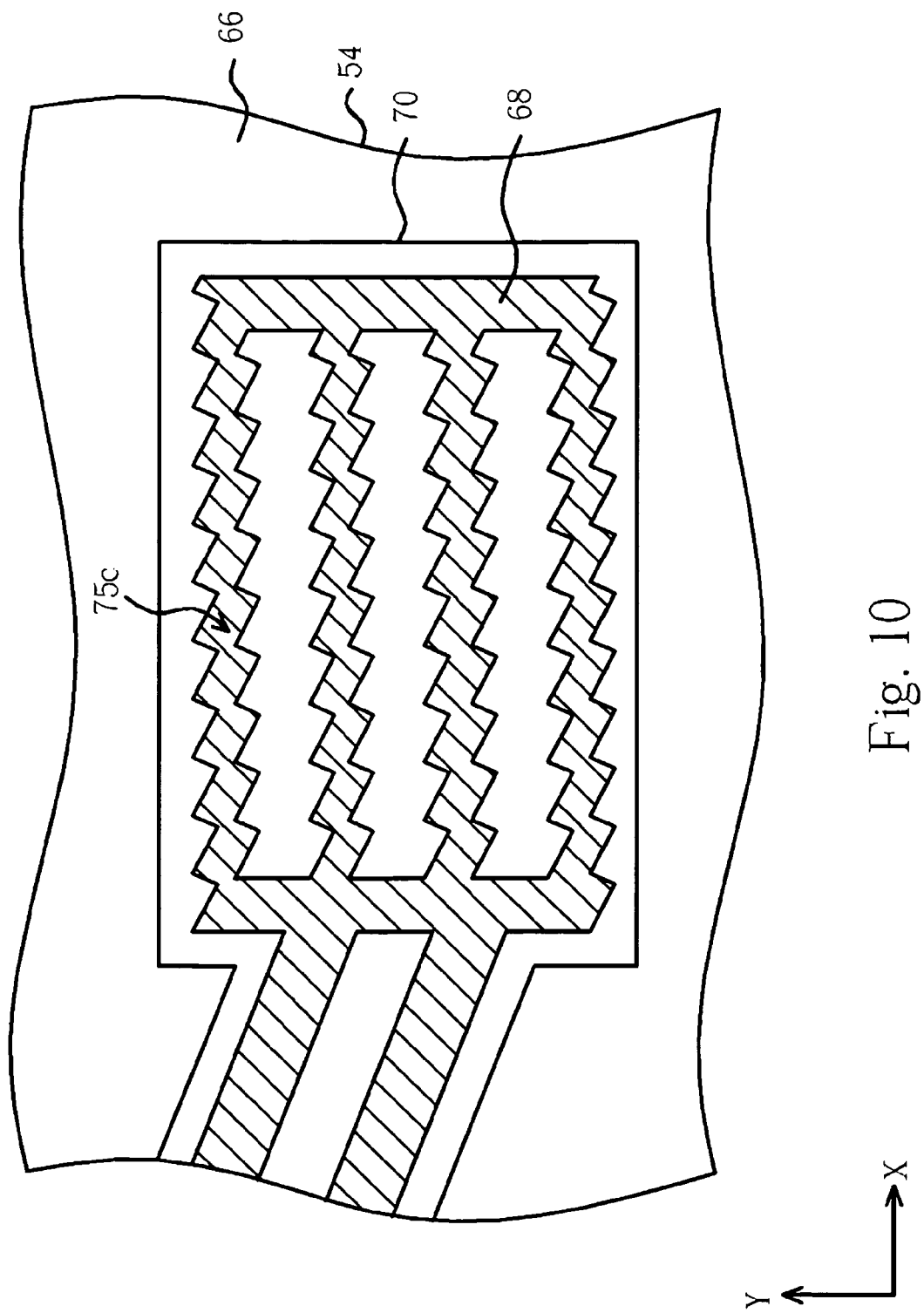

It should be noted that the shape in top-view of the grooves of the first insulator 66 is not limited to the shape shown in FIG. 6. Any conducting pad with the first insulator 66 having a groove filled with the second conductive layer 68 may be included in the spirit of the present invention. FIGS. 8-10 are enlarged schematic diagrams of conducting pads according to a second embodiment, a third embodiment, and a fourth embodiment of the present invention respectively. Most of the numerals of elements in FIGS. 8-10 are the same as that in FIG. 6 for simplifying explanation. As shown in FIG. 8, the grooves 75a of the first insulator 66 are arranged as a grid. In FIG. 9, many of the grooves 75b are arranged parallel with each other. On the other hand, the grooves 75c in FIG. 10 have uneven shapes.

Figure 11:
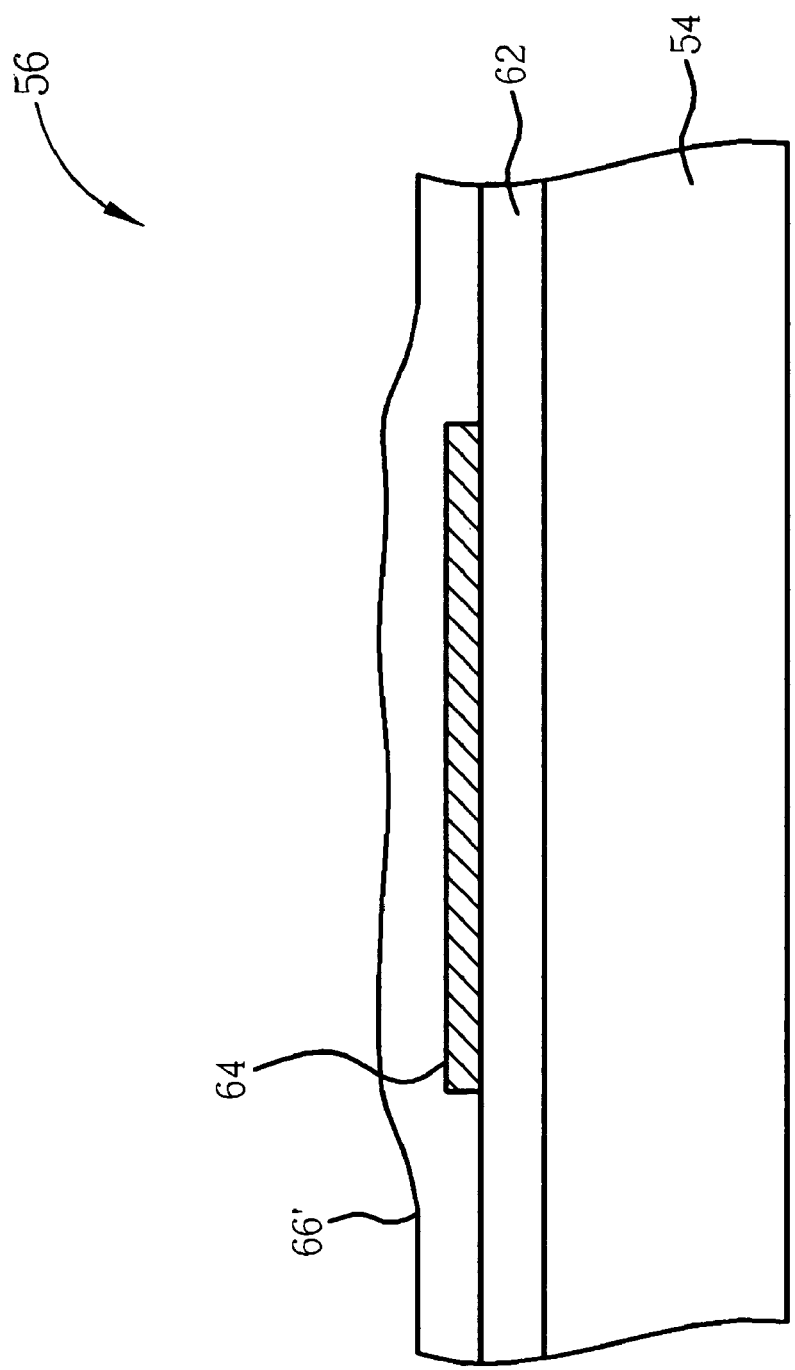
FIGS. 11-14 are schematic diagrams of the fabrication processes of the conducting pad shown in FIG. 7.

The fabrication method of the conducting pad 56 according to the present invention is described below. Referring to FIGS. 11-14, FIGS. 11-14 are schematic diagrams of the fabrication process of the conducting pad 56 shown in FIG. 7. As shown in FIG. 11, the second substrate 54 is provided. Then, a first insulating layer (numeral 62) and a first conductive layer (numeral 64) are formed on the second substrate 54 sequentially. The first insulating layer is defined as the base layer 62 of the conducting pad 56. A first photolithography-etching process (PEP) is following performed to pattern the first conductive layer 64 so as to form the patterned first conductive layer 64 in FIG. 11. After that, a second insulating layer 66' is deposited on the patterned first conductive layer 64 and the base layer 62. The second insulating layer 66' preferably comprises silicon oxide or silicon nitride.

Figure 12:
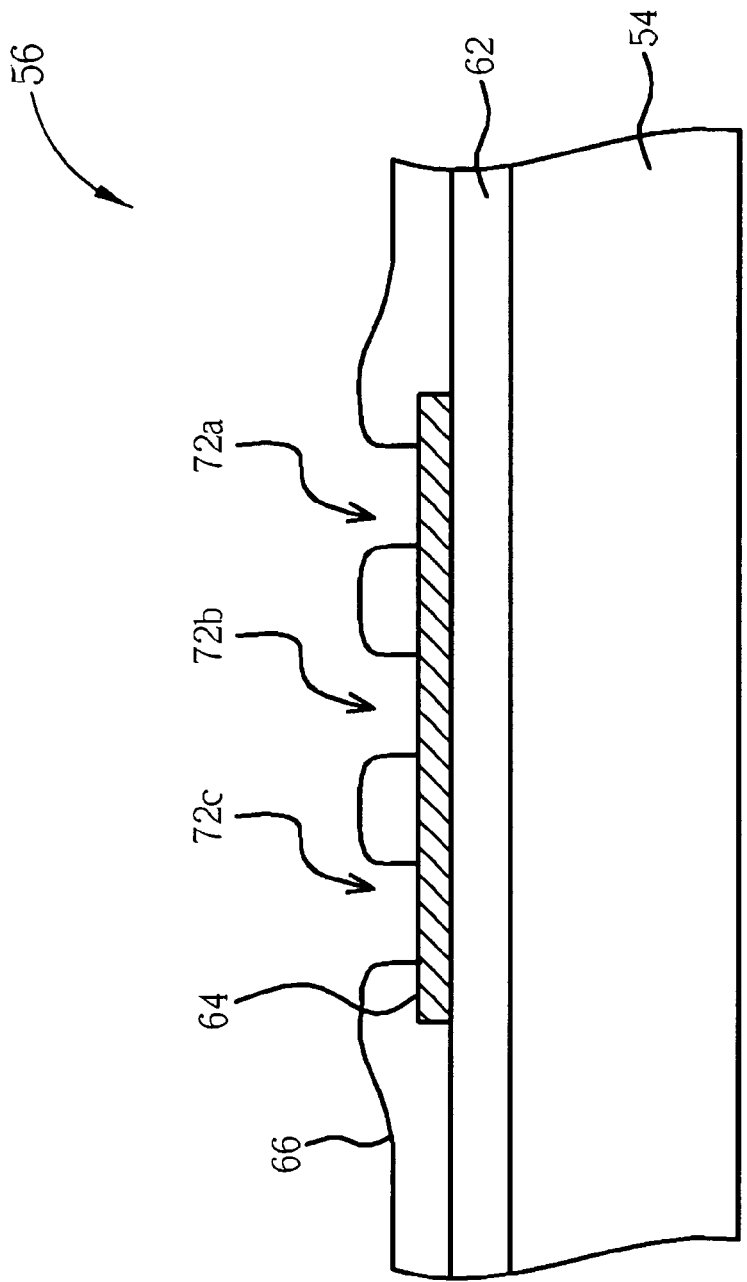

Referring to FIG. 12, a second PEP is then performed to the second insulating layer 66' for forming a plurality of first grooves 72a, 72b, 72c and a second groove 74 (not shown in FIG. 12) in each conducting pad 56 so as to complete the first insulator 66 of the conducting pad 56. On the other hand, the third grooves 78a, 78b of the wire 76 shown in FIG. 6 are also formed during the second PEP.

Figure 13:
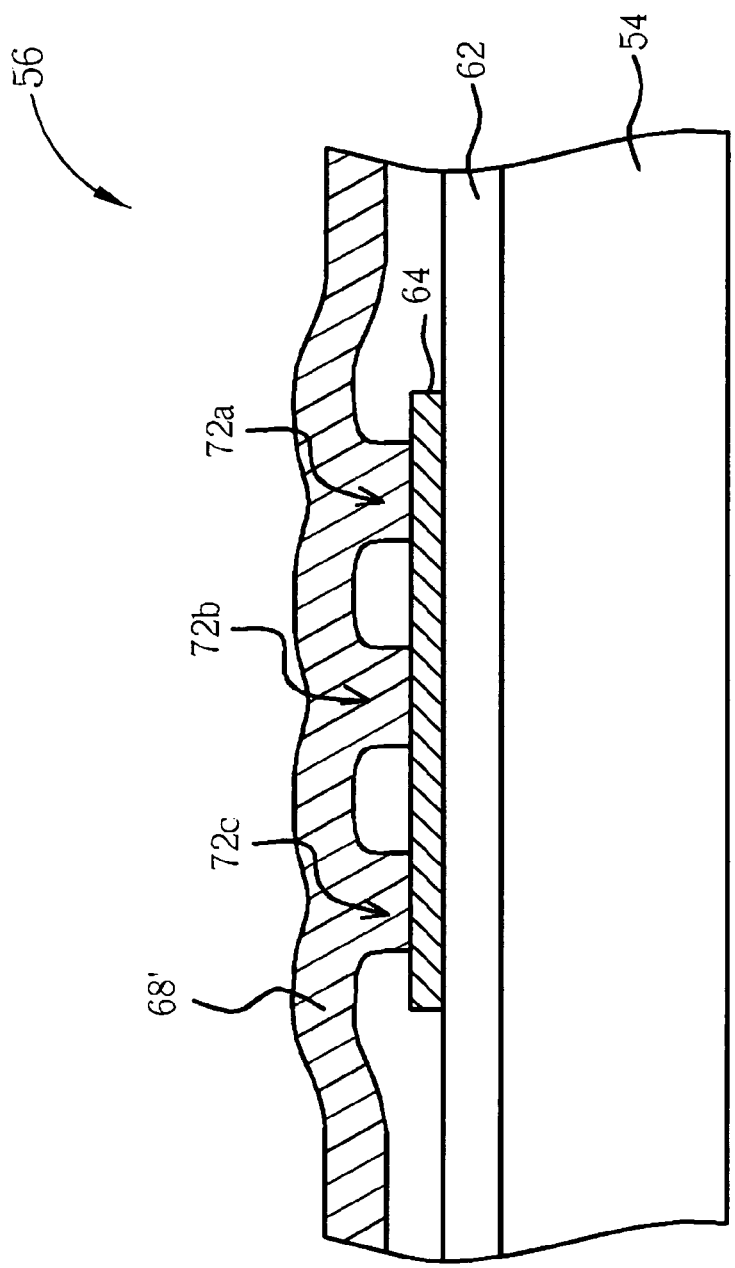
Figure 14:
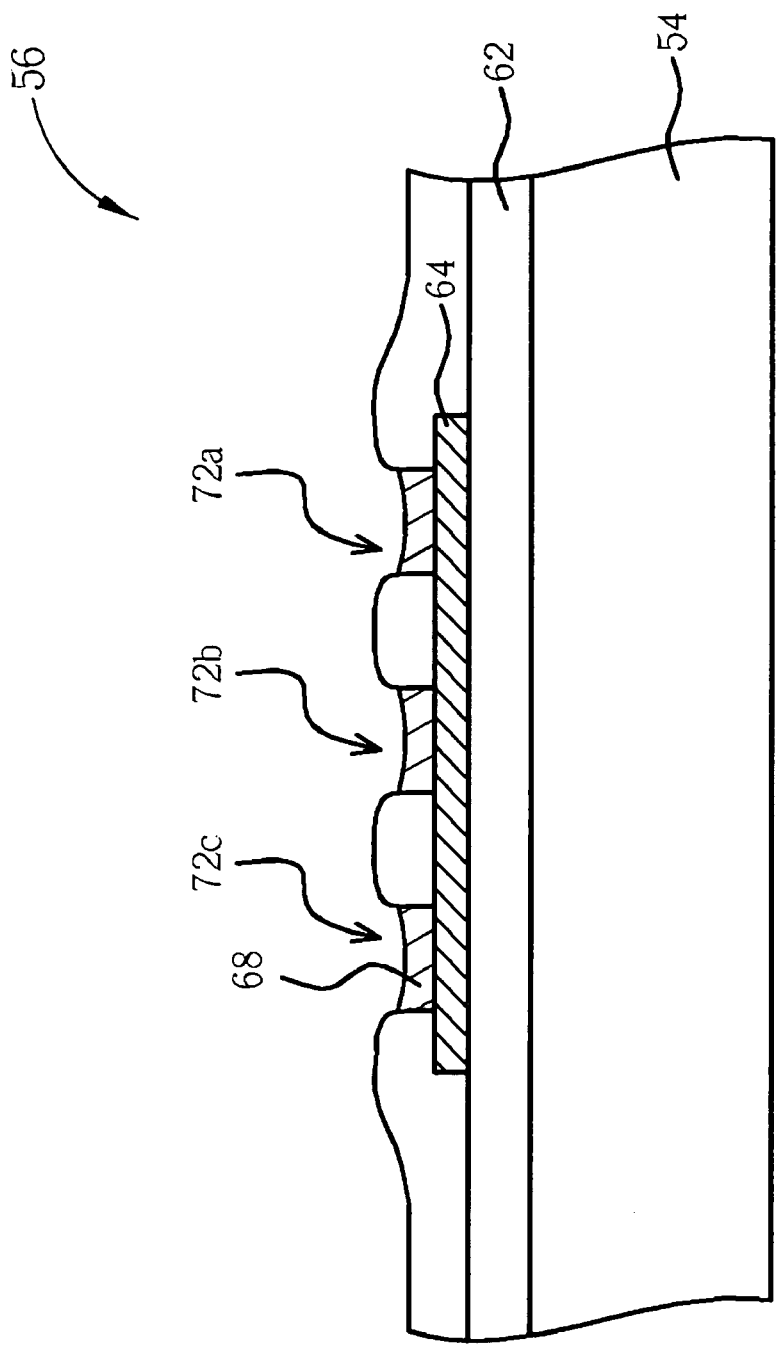

Please refer to FIG. 13 and FIG. 14, a second conductive layer 68' is fully formed on the second substrate 54 so that the first grooves 72a, 72b, 72c, the second groove 74, and the third grooves 78a, 78b are all filled with the second conductive layer 68'. The second conductive layer 68' is then etched back (or removed by a PEP) such that the portions of the second conductive layer 68' positioned on the first insulator 66 are removed and the remainders are all disposed inside the first grooves 72a, 72b, 72c, the second groove 74, and the third grooves 78a, 78b, as presented with the numeral 68 in FIG. 14. The second conductive layer 68 is preferably formed with metal materials that have lower impedance, and preferably comprises aluminum (Al), molybdenum (Mo), or alloy of Al and Mo, such as Mo/Al/Mo or Ti/Al/Ti. Then, a third conductive layer is formed on the second substrate 54 and a third PEP is performed to pattern the third conductive layer for forming a patterned third conductive layer 70 covering the first conductive layer 64 and the second conductive layer 68 so as to complete the fabrication of the conducting pad 56, as shown in FIG. 7.

The fabrication of the conducting pad 56 can be accompanied with the fabrication of elements of pixel array area 58, such as thin film transistors (TFTs), scan lines, or signal lines. The complete fabrication process of the elements of pixel array area 58 generally has five or six photolithography-etching processes in an amorphous silicon TFT process and eight or nine photolithography-etching processes in an low temperature polysilicon thin film transistor (LTPS TFT) process, and which may include the first to third PEP described-above for fabricating the conducting pad 56. For example, the first conductive layer 64 can be fabricated together with gates of TFTs or scan lines, and they may have the same materials. The first insulator layer 66 can be fabricated together with gate insulators of TFTs and they may comprise the same materials; the second conductive layer 68 can comprise the same material as the sources, drains, or signal lines, and the third conductive layer 70 may comprise the same material as pixel electrodes, such as ITO. Therefore, no extra photomasks or fabrication processes are needed.

In another embodiment of the present invention, the conducting pad 56 only comprises the first insulator 66 with the first grooves 72a, 72b, 72c and the second groove 74, the second conductive layer 68 filled inside the grooves, and the third conductive layer 70, without the first conductive layer 64.

The advantages of the present invention include that the second conductive layer with softer materials is positioned inside the grooves so that it is protected by the harder first insulator and the harder third conductive layer. Accordingly, the second conductive layer of one present invention conducting pad is not easily shifted by external stresses or by the third conductive layer resulting in touching other conducting pads or elements on the second substrate and causing a circuit short. Since the second conductive layer formed with materials having lower impedance is more difficult to break, the present invention can provide a preferable conduction performance. In addition, because the first and second conductive layers operate in parallel, the first conductive layer can still provide conduction function of the conducting pad even when the second conductive layer is unfortunately broken under external stresses or has defects during fabrication processes. Therefore the fabrication yield can be effectively increased without extra cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system for providing conducting pads of a display panel, each of the conducting pads comprising:
   a first insulator on a substrate having a plurality of grooves;
   a second conductive layer filled inside the grooves, wherein the first insulator has an outermost surface more elevated than all other surfaces of the second conductive layer, and the first insulator and the second conductive layer exhibit a discontinuous profile; and
   a patterned third conductive layer covering the second conductive layer; wherein the first insulator serves as a barricade for fixing the second conductive layer in the grooves.

2. The system as claimed in claim 1, wherein the system further comprises a base layer on the substrate, a patterned first conductive layer above the base layer, and the patterned third conductive layer completely covers the first conductive layer and the second conductive layer.

3. The system as claimed in claim 2, wherein the first conductive layer is a metal layer.

4. The system as claimed in claim 2, wherein the second conductive layer filled inside the grooves are electrically connected to the first conductive layer.

5. The system as claimed in claim 2, wherein the base layer comprises insulating materials.

6. The system as claimed in claim 1, wherein the hardness of the third conductive layer is harder than that of the second conductive layer.

7. The system as claimed in claim 1, wherein the grooves comprises a plurality of first grooves parallel with each other and a second groove connecting with each of the first grooves.

8. The system as claimed in claim 1, wherein the grooves are arranged as a grid.

9. The system as claimed in claim 1, wherein the system further comprises:
   a display device comprising the display panel with the conducting pads; and
   a controller coupled to the display panel, the controller being operative to control the display panel to render images in accordance with input.

10. The system as claimed in claim 9, wherein the system further comprises an electronic device comprising the display device, and the electronic device is a laptop computer, a mobile phone, a digital camera, a personal digital assistant (PDA), a desktop computer, a television, a car display or a portable DVD player.

11. The system as claimed in claim 1, wherein the display panel further comprises a plurality of wires on the substrate, the wires electrically connecting to the conducting pads, each of the wires in a region comprising:
   a first conductive layer on the substrate;
   a first insulator covering the first conductive layer of the wire, having a plurality of third grooves; and
   a second conductive layer filled inside the third grooves.

12. The system as claimed in claim 11, wherein the second conductive layers of the wires comprise the same materials as the second conductive layers of the conducting pads, and the first conductive layers of the wires comprise the same materials as the first conductive layers of the conducting pads.

13. The system as claimed in claim 11, wherein the first conductive layer comprises the same materials as gates of TFTs of the display panel.

14. The system as claimed in claim 11, wherein the second conductive layer comprises the same materials as sources/drains of TFTs of the display panel.

15. The system as claimed in claim 11, wherein the system further comprises:
   a display device comprising the display panel; and
   a controller coupled to the display panel, the controller being operative to control the display panel to render images in accordance with input.

16. The system as claimed in claim 15, wherein the system further comprises an electronic device comprising the display device, and the electronic device is a laptop computer, a mobile phone, a digital camera, a personal digital assistant (PDA), a desktop computer, a television, a car display or a portable DVD player.

17. A system for providing conducting pads of a display panel, the display panel comprising:
   a first substrate;
   a second substrate positioned below the first substrate;
   a pixel array area between the first substrate and the second substrate;
   a control circuit area between the first substrate and the second substrate;
   a periphery circuit area on an uncovered region of the second substrate;
   a plurality of conducting pads on the periphery circuit area; and
   a plurality of wires, the wires electrically connecting to the conducting pads, each of the wires in a region comprising:
      a first conductive layer on the second substrate;
      a first insulator covering the first conductive layer of the wire, having a plurality of grooves; and
      a second conductive layer only filled inside the grooves, wherein the first insulator has an outermost surface more elevated than all other surfaces of the second conductive layer, and the first insulator and the second conductive layer exhibit a discontinuous profile.

* * * * *